US012805250B2

(12) United States Patent
Jeong et al.

(10) Patent No.: US 12,805,250 B2
(45) Date of Patent: Nov. 17, 2026

(54) SUBSTRATE PROCESSING APPARATUS

(71) Applicant: ASM IP Holding B.V., Almere (NL)

(72) Inventors: WonKi Jeong, Cheonan-si (KR); DaeYoun Kim, Seo-gu (KR)

(73) Assignee: ASM IP Holding B.V., Almere (NL)

( * ) Notice: Subject to any disclaimer, the term of this patent is extended or adjusted under 35 U.S.C. 154(b) by 490 days.

(21) Appl. No.: 18/371,227

(22) Filed: Sep. 21, 2023

(65) Prior Publication Data

US 2024/0105479 A1 Mar. 28, 2024

Related U.S. Application Data

(60) Provisional application No. 63/409,881, filed on Sep. 26, 2022.

(51) Int. Cl.

| | |
|---|---|
| ***H01L 21/67*** | (2006.01) |
| ***H01J 37/32*** | (2006.01) |
| ***H10P 72/00*** | (2026.01) |

(52) U.S. Cl.

CPC .... *H10P 72/0602* (2026.01); *H01J 37/32357* (2013.01); *H01J 37/32522* (2013.01); *H01J 37/32862* (2013.01); *H10P 72/0402* (2026.01); *H01J 2237/002* (2013.01)

(58) Field of Classification Search

CPC ............ H10P 72/0402; H10P 72/0602; H10P 72/0434; H01J 37/32357; H01J 37/32522; H01J 2237/002

See application file for complete search history.

(56) References Cited

U.S. PATENT DOCUMENTS

| | | | | |
|---|---|---|---|---|
| 5,364,488 | A * | 11/1994 | Minato | H01J 37/32522 118/724 |
| 8,137,467 | B2 | 3/2012 | Meinhold | |
| 9,034,142 | B2 | 5/2015 | Bartlett | |
| 10,584,415 | B2 | 3/2020 | Meinhold | |
| 2002/0007912 | A1 * | 1/2002 | Kamarehi | H01J 37/32357 156/345.12 |
| 2007/0042117 | A1 * | 2/2007 | Kuppurao | C23C 16/46 118/724 |
| 2007/0163502 | A1 * | 7/2007 | Nozawa | H10P 72/0434 118/723 R |
| 2009/0255798 | A1 * | 10/2009 | Furuta | C23C 16/5096 118/723 I |
| 2019/0256977 | A1 | 8/2019 | Meinhold | |
| 2021/0225673 | A1 * | 7/2021 | Wei | H10P 72/0452 |
| 2022/0282377 | A1 | 9/2022 | Luo | |

* cited by examiner

*Primary Examiner* — Joseph A Miller, Jr.

(74) *Attorney, Agent, or Firm* — Snell & Wilmer L.L.P.

(57) ABSTRACT

A substrate processing apparatus may be presented. The apparatus comprising a substrate reaction chamber configured to hold and process a substrate, a remote plasma unit for generating a radical gas to clean the substrate reaction chamber, a cooling unit, the cooling unit comprising: a tank configured to store water for cooling, a fan configured to generate an air flow, a plurality of fins placed in front of the fan, a plurality of cooling pipes configured to circulate the water from the tank and positioned to pass through in front of the fan, wherein the water passing through the cooling pipes cools down the air flow generated by the fan.

19 Claims, 3 Drawing Sheets

SUBSTRATE PROCESSING APPARATUS

CROSS-REFERENCE TO RELATED APPLICATIONS

This application claims priority to U.S. Provisional Patent Application Ser. No. 63/409,881 filed Sep. 26, 2022 and titled SUBSTRATE PROCESSING APPARATUS, the disclosure of which is hereby incorporated by reference in its entirety.

FIELD OF INVENTION

The present disclosure relates to an apparatus for processing a substrate, particularly to an apparatus that is more efficient in cooling down from an elevated temperature of a chemical reaction during substrate processing.

BACKGROUND OF THE DISCLOSURE

Conventionally, a process gas is supplied to the chamber through a showerhead during substrate process. The showerhead must be controlled to be at a specific temperature to maintain the characteristics of the process gas to a constant state. Because the showerhead must be maintained at a certain temperature, both a device for supplying heat to the showerhead and a device for cooling down the showerhead are needed.

Of the two functions for heat supply and cooling, the present disclosure proposes to improve showerhead cooling.

It should be noted that the showerhead also functions as an electrode to generate plasma. To this end, certain electrical components are applied to the showerhead during substrate process.

When more than a certain level of RF (Radio Frequency) plasma power is applied in a specific process, this may increase the temperature of the showerhead. This increase may occasionally occur rapidly. This rapid temperature rise may result in loss of the temperature control. Therefore, the present disclosure proposes to enhance the cooling performance leading to efficient cooling.

Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In accordance with one embodiment there may be provided, a substrate processing apparatus comprising: a substrate reaction chamber configured to hold and process a substrate; a remote plasma unit for generating a radical gas to clean the substrate reaction chamber; a cooling unit, the cooling unit comprising: a tank configured to store water for cooling; a fan configured to generate an air flow; a plurality of fins placed in front of the fan; a plurality of cooling pipes configured to circulate the water from the tank and positioned to pass through in front of the fan; wherein the water passing through the cooling pipes cools down the air flow generated by the fan.

In at least one aspect, the substrate processing apparatus further comprising an inlet hood configured above the substrate reaction chamber to supply the air flow generated by the fan to the substrate reaction chamber.

In at least one aspect, the substrate processing apparatus further comprising an outlet hood configured above the substrate reaction chamber across the inlet hood to let out the air flow.

In at least one aspect, the substrate processing apparatus further comprising an exhaust fan installed in the outlet hood to expedite the air flow exhaust from the substrate reaction chamber.

In at least one aspect, the number of the outlet hoods is equal to or greater than 2.

In at least one aspect, the number of the outlet hoods is equal to or greater than 2 and an exhaust fan is installed in each outlet hood to expedite the air flow exhaust from the substrate reaction chamber.

In at least one aspect, the substrate processing apparatus further comprising a controller operably connected to a temperature sensor and the fan to control the rotation of the fan if the temperature measured by the temperature sensor is above a threshold.

In at least one aspect, the substrate processing apparatus further comprising a controller operably connected to a temperature sensor and the plurality of fins to control the angle of the fins if the temperature measured by the temperature sensor is above a threshold.

In at least one aspect, the controller further operably connected to the plurality of fins to control the rotation of the fan and the angle of the fins if the temperature measured by the temperature sensor is above a threshold.

In at least one aspect, the number of the temperature sensors is equal to or greater than 1.

In at least one aspect, the fins are constructed and arranged to direct the air flow into the reaction chamber.

BRIEF DESCRIPTION OF THE DRAWING FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

FIG. 1 (*b*) shows a side view of FIG. 1 (*a*) viewed from direction A.

DETAILED DESCRIPTION OF EXEMPLARY EMBODIMENTS

Figure 1:
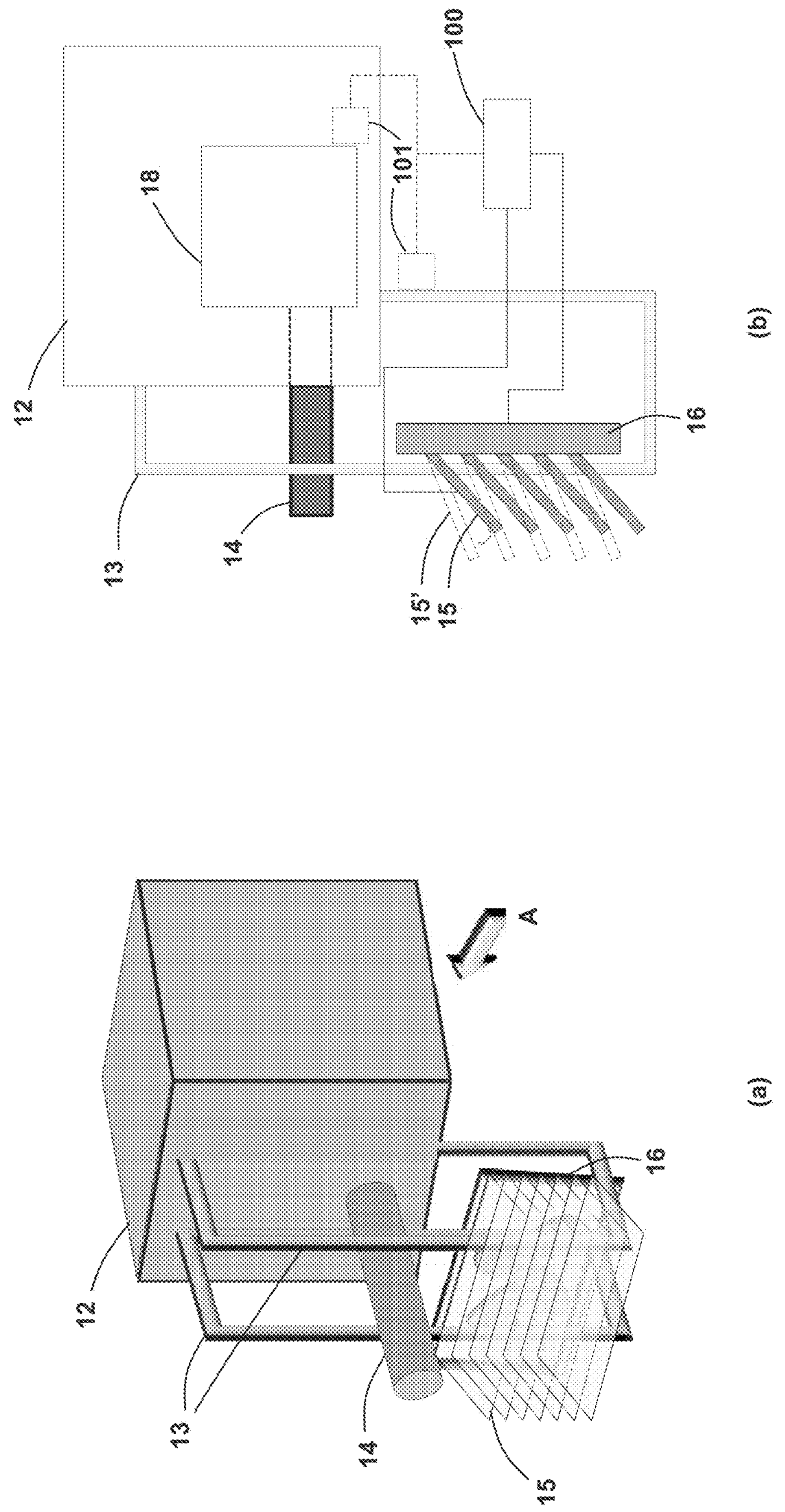
FIG. 1 (*a*) shows a perspective view of a process cooling water (PCW) block, pipes, fan and the fins of the present disclosure.

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

As used herein, the term "substrate" may refer to any underlying material or materials, including any underlying material or materials that may be modified, or upon which, a device, a circuit, or a film may be formed. The "substrate" may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

As examples, a substrate in the form of a powder may have applications for pharmaceutical manufacturing. A porous substrate may comprise polymers. Examples of workpieces may include medical devices (for example, stents and syringes), jewelry, tooling devices, components for battery manufacturing (for example, anodes, cathodes, or separators) or components of photovoltaic cells, etc.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

Non-limiting examples of a continuous substrate may include a sheet, a non-woven film, a roll, a foil, a web, a flexible material, a bundle of continuous filaments or fibers (for example, ceramic fibers or polymer fibers). Continuous substrates may also comprise carriers or sheets upon which non-continuous substrates are mounted.

The illustrations presented herein are not meant to be actual views of any particular material, structure, or device, but are merely idealized representations that are used to describe embodiments of the disclosure.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

A process chamber may be equipped with a reactor and an Remote Plasma Unit (RPU), such that a main process takes place in the reactor.

After a certain number of processes are run, the chamber may periodically be cleaned. The cleanings may be performed using the RPU. The RPU uses plasma to generate an F radical from an etching gas, and then supplies the generated radical to the reactor.

The F radical generated in this process reacts violently with other substances, sometimes resulting in a strong exothermic reaction. Due to a high temperature generated from the reaction, the portion of the chamber where the strongest exothermic reaction takes place is protected by a PCW (Process Cooling Water) block to protect other mechanical parts.

The PCW block may comprise a tank 12 where process cooling water circulates and a pipe 14 that distributes and connects the cleaning gas to each reactor.

FIG. 1 (*a*) shows a system in accordance with the present disclosure. A tank 12 which contains and circulates process cooling water and a pipe 14 which distributes the cleaning gas generated from RPU 18 to each reactor chamber. The RPU 18 can be placed inside or outside of the tank 12. A plurality of cooling pipes 13 from tank 12 can circulate water for efficient cooling effect.

FIG. 1 (*b*) is a cross-sectional view of the system illustrated in FIG. 1 (*a*).

FIG. 1 (*b*) shows that the cooling pipes 13 may go through in front of a fan 16 and fins 15 may be placed in front of the fan 16. To improve cooling efficiency, fins 15 may be installed between the fan 16 and the cooling pipes 13.

The water in the tank 2 is circulated through the cooling pipes 13 so that the heat of the water can dissipate outside.

A controller 100 may be operably coupled with a temperature sensor 101 and a fan 16.

The temperature sensor 101 can be placed in multiple areas where temperature may be important. Some of the areas where the sensor 101 may be placed would be in the tank 12 and cooling pipe 13. The controller 100 may monitor temperatures of areas where temperature sensor 101 may be placed and tone up the rotation of the fan 16 if the temperature measured by the sensor 101 may exceed a temperature threshold. This temperature threshold may be set and updated when need arises.

When the temperature may get lower than the threshold, the controller 100 may also control the fan 16 to tone down the rotation speed of the fan 16.

Figure 2:
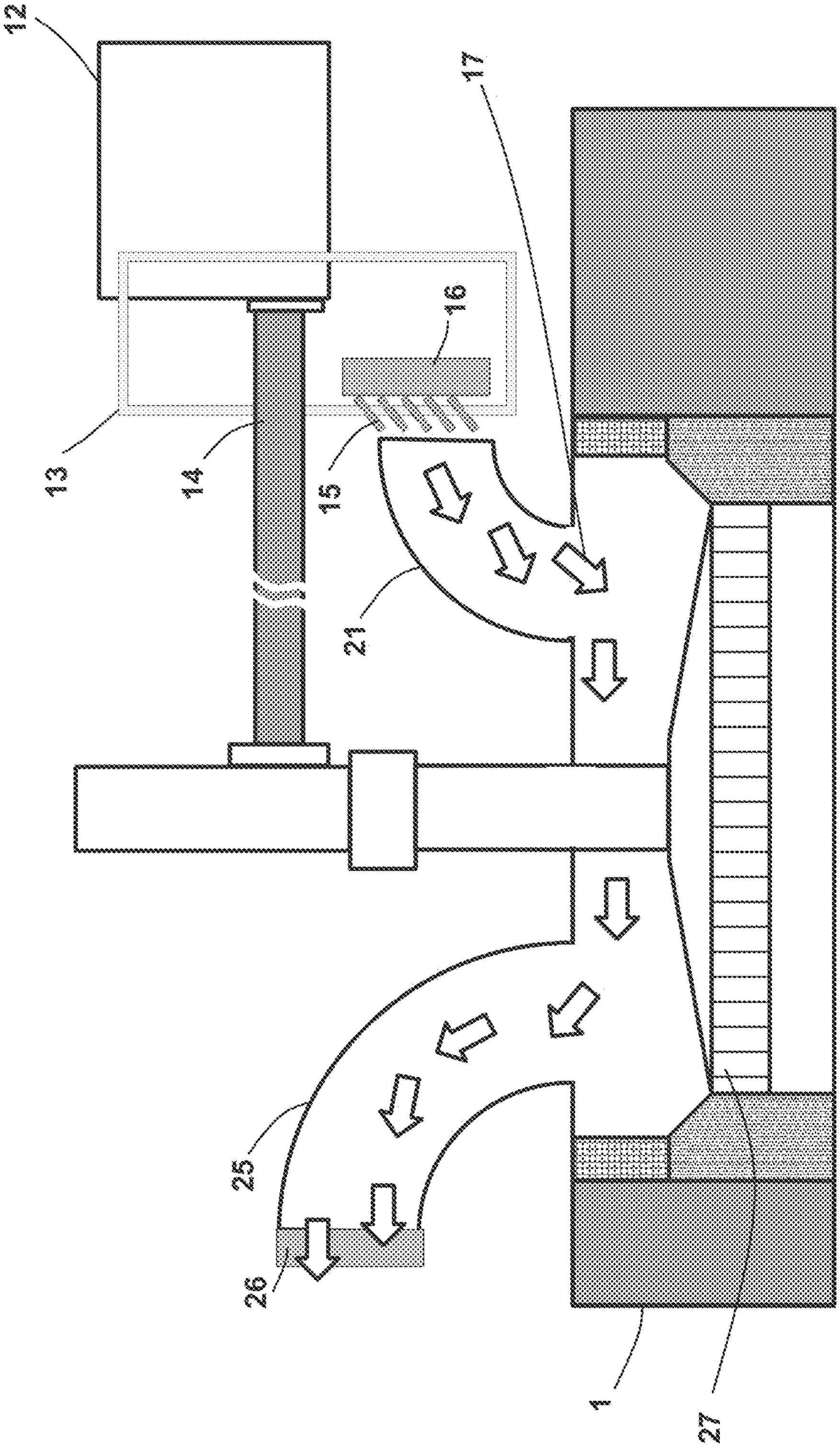
FIG. 2 shows an overview of the present disclosure along with the PCW block and reaction chamber according to an embodiment of the present disclosure.

In FIG. 2, however, the water in the cooling pipes 13 can be also used to cool down the air flow 17 generated by the fan 16. The air flow 17 generated can be directed into the chamber 1 by the fins 15.

Also, the fins 15 can be used to cool down the air that goes through the fins 15.

As shown in FIG. 2, an air flow 17 may be generated by the fan 16 and the fins 15 can direct the generated air flow 17 into the chamber 1 through the inlet hood 21.

The controller 100 may also be operably coupled with the fins 15.

In this case, the controller 100 may monitor the temperature of the sensor 101 and when the measured temperature may exceed the temperature threshold, the controller 100 would change the angle of the fins 15 so that more of the air flow 17 would be directed into the chamber 1 through the inlet hood 21.

The fin's angle change may be illustrated in FIG. 1 (*b*).

The fins 15, 15' have different angles and this angle difference would result in different amount of air flow 17 to be directed into the chamber through the inlet hood 21. This different amount of air flow 17 may cause a certain temperature difference measured by the temperature sensor 101.

The controller 100 may monitor the temperature from the sensor 101 and may control the fan 16 or the fins 15 or both the fan 16 and the fins 15 when the temperature may exceed the threshold. Control of the fan 16 would mean rotation speed change of the fan 16 and control of the fins 15 would mean angle change of the fins 15 (and 15').

The air flow 17 may go into the reaction chamber 1 but the air flow 17 only go through above the showerhead 27. When the fan 16 is running, the air flow 17 generated by the fan 16 may be cooled down by the cooling pipe 13 and the fins 15. The cooled air flow 17 is supplied into the reactor 1 in a concentrated state through an inlet hood 21.

The supplied air may pass through the upper part of a Gas Curtain (not illustrated) and then through an RF cover (not illustrated) and a RF rod cover (not illustrated). Even though they are not drawn, the gas curtain, RF cover, and RF rod cover may be parts that can insulate the showerhead and the chamber from the outside.

The air flow 17 may be used to remove the heat from a showerhead 27. This air flow 17 heated from the reactions in the reaction chamber 1 and showerhead 27 may be expelled out of the reactor through an outlet hood 25. An exhaust fan 26 may be attached to the outlet hood 25, which can make the exhaust of this air flow 17 smoother.

Figure 3:
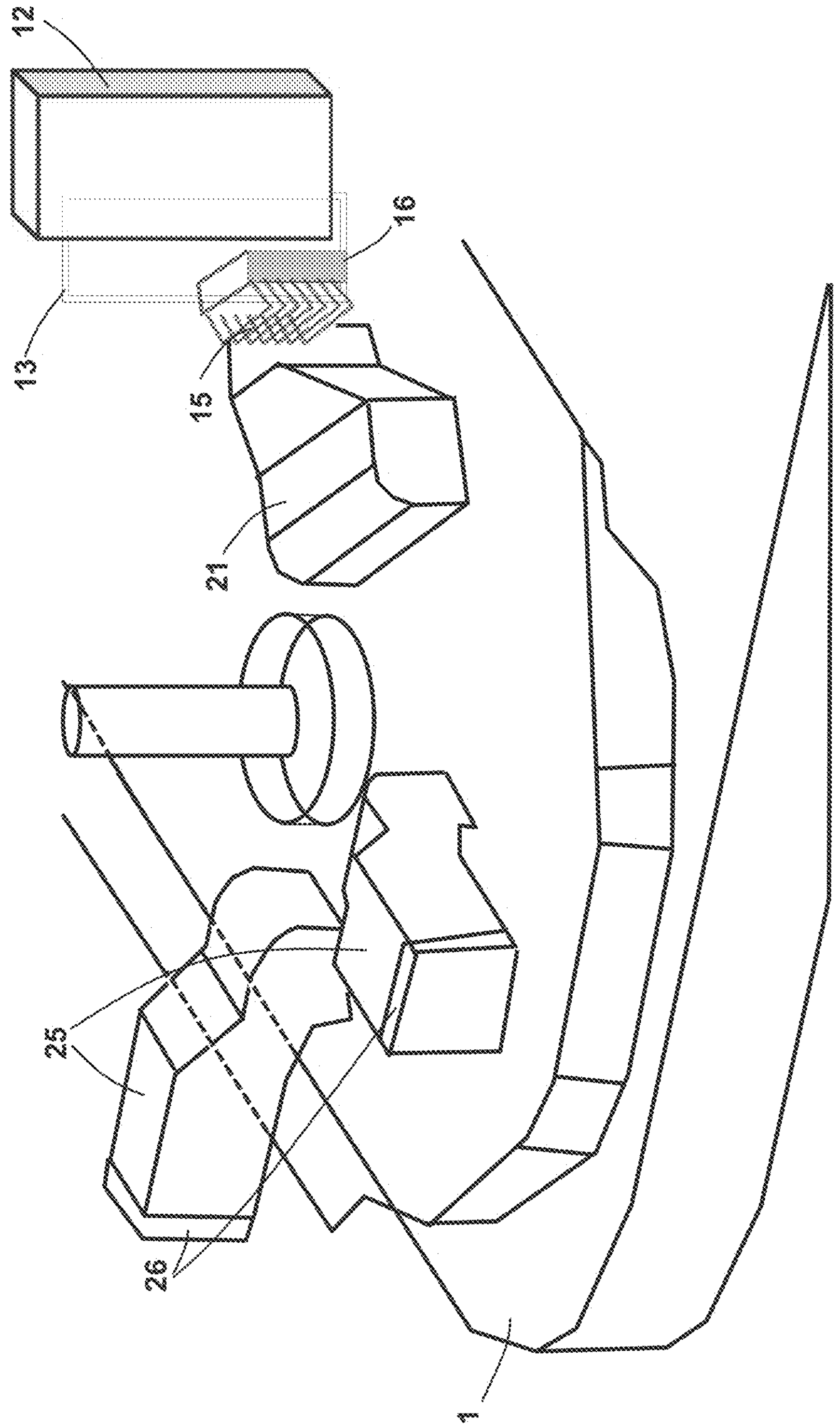
FIG. 3 shows another overview of the chamber according to another embodiment of the present disclosure.

As can be shown in FIG. 3, more than one outlet hoods 25 can be placed above the reaction chamber 1 to facilitate the air flow 17 exhaust. Each outlet hood may have exhaust fan 26.

Exhaust fan 26, along with the fan 16, can make the cool down of the showerhead more efficient due to the rapid gas exhaust caused from the fans 16, 26.

By the movement of air flow 17, the temperature of the showerhead 27 can be maintained and controlled within a certain range.

The above-described arrangements of apparatus are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

The invention claimed is:

1. A substrate processing apparatus comprising:
- a substrate reaction chamber configured to hold and process a substrate;
- a remote plasma unit configured to generate a radical gas for cleaning the substrate reaction chamber;
- a gas pipe between the remote plasma unit and the substrate reaction chamber; and
- a cooling unit, the cooling unit comprising:
  - a tank configured to store water for cooling, wherein the remote plasma unit is within the tank;
  - a fan configured to generate an air flow;
  - a plurality of fins placed in front of the fan; and
  - a plurality of cooling pipes configured to circulate the water from the tank and positioned to pass through in front of the fan;
- wherein at least one cooling pipe of the plurality of cooling pipes is disposed between the fan and the substrate reaction chamber, and
- wherein the water passing through the cooling pipes cools down the air flow generated by the fan.

2. The substrate processing apparatus according to claim 1, further comprising:
- an inlet hood downstream of the fan and above the substrate reaction chamber to supply the air flow generated by the fan to the substrate reaction chamber.

3. The substrate processing apparatus according to claim 2, further comprising:
- an outlet hood configured above the substrate reaction chamber across the inlet hood to let out the air flow.

4. The substrate processing apparatus according to claim 3, further comprising:
- an exhaust fan installed in the outlet hood to expedite the air flow exhaust from the substrate reaction chamber.

5. The substrate processing apparatus according to claim 3, wherein a number of the outlet hoods above the substrate reaction chamber is equal to or greater than 2.

6. The substrate processing apparatus according to claim 4, wherein the number of the outlet hoods is equal to or greater than 2 and an exhaust fan is installed in each outlet hood to expedite the air flow exhaust from the substrate reaction chamber.

7. The substrate processing apparatus according to claim 1, further comprising:
- a controller operably connected to a temperature sensor and the fan to control the rotation of the fan if the temperature measured by the temperature sensor is above a threshold.

8. The substrate processing apparatus according to claim 1, further comprising:
- a controller operably connected to a temperature sensor and the plurality of fins to control the angle of the fins if the temperature measured by the temperature sensor is above a threshold.

9. The substrate processing apparatus according to claim 7, wherein the controller is further operably connected to the plurality of fins to control the rotation of the fan and the angle of the fins if the temperature measured by the temperature sensor is above the threshold.

10. The substrate processing apparatus according to claim 7, wherein the substrate processing apparatus comprises more than one temperature sensor.

11. The substrate processing apparatus according to claim 1, wherein the fins are constructed and arranged to direct the air flow into the reaction chamber.

12. The substrate processing apparatus according to claim 1, wherein the gas pipe is between two cooling pipes of the plurality of cooling pipes.

13. The substrate processing apparatus according to claim 1, further comprising a showerhead, wherein the air flow goes above the showerhead.

14. A substrate processing apparatus comprising:
- a substrate reaction chamber configured to hold and process a substrate;
- a remote plasma unit configured to generate a radical gas for cleaning the substrate reaction chamber;
- a gas pipe between the remote plasma unit and the substrate reaction chamber; and
- a cooling unit, the cooling unit comprising:
  - a tank configured to store water for cooling;
  - a fan configured to generate an air flow;
  - a plurality of fins placed in front of the fan;
  - a plurality of cooling pipes configured to circulate the water from the tank and positioned to pass through in front of the fan, wherein at least one cooling pipe of the plurality of cooling pipes is disposed between the fan and the substrate reaction chamber, and wherein the water passing through the cooling pipes cools down the air flow generated by the fan; and a controller operably connected to a temperature sensor and the fan to control the rotation of the fan if the temperature measured by the temperature sensor is above a threshold, wherein the temperature sensor is within the tank.

15. The substrate processing apparatus according to claim 14, wherein the controller is further operably connected to the plurality of fins to control the rotation of the fan and the angle of the fins if the temperature measured by the temperature sensor is above the threshold.

16. The substrate processing apparatus according to claim 14, wherein the substrate processing apparatus comprises more than one temperature sensor.

17. A substrate processing apparatus comprising:

a substrate reaction chamber configured to hold and process a substrate;

a remote plasma unit configured to generate a radical gas for cleaning the substrate reaction chamber;

a gas pipe between the remote plasma unit and the substrate reaction chamber; and a cooling unit, the cooling unit comprising:

a tank configured to store water for cooling;

a fan configured to generate an air flow;

a plurality of fins placed in front of the fan;

a plurality of cooling pipes configured to circulate the water from the tank and positioned to pass through in front of the fan, wherein at least one cooling pipe of the plurality of cooling pipes is disposed between the fan and the substrate reaction chamber, and wherein the water passing through the cooling pipes cools down the air flow generated by the fan; and a controller operably connected to a temperature sensor and the fan to control the rotation of the fan if the temperature measured by the temperature sensor is above a threshold, wherein the temperature sensor is on a cooling pipe of the plurality of cooling pipes.

18. The substrate processing apparatus according to claim 17, wherein the controller is further operably connected to the plurality of fins to control the rotation of the fan and the angle of the fins if the temperature measured by the temperature sensor is above the threshold.

19. The substrate processing apparatus according to claim 17, wherein the substrate processing apparatus comprises more than one temperature sensor.

* * * * *